United States Patent
Chinnakkonda Vidyapoornachary et al.

(10) Patent No.: US 10,446,255 B2
(45) Date of Patent: Oct. 15, 2019

(54) REFERENCE VOLTAGE CALIBRATION IN MEMORY DURING RUNTIME

(71) Applicant: International Business Machines Corporation, Armonk, NY (US)

(72) Inventors: Diyanesh B. Chinnakkonda Vidyapoornachary, Bangalore (IN); Edgar R. Cordero, Round Rock, TX (US); Stephen P. Glancy, Poughkeepsie, NY (US); Jeremy R. Neaton, Fishkill, NY (US); Saravanan Sethuraman, Bangalore (IN)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/180,624

(22) Filed: Jun. 13, 2016

(65) Prior Publication Data
US 2017/0358369 A1    Dec. 14, 2017

(51) Int. Cl.
*G11C 29/50* (2006.01)
*G11C 29/02* (2006.01)
(Continued)

(52) U.S. Cl.
CPC ...... *G11C 29/50004* (2013.01); *G06F 11/106* (2013.01); *G11C 5/147* (2013.01);
(Continued)

(58) Field of Classification Search
CPC ............ G11C 5/147; G11C 2207/2254; G11C 29/028; G11C 11/1673; G11C 16/3431;
(Continued)

(56) References Cited

U.S. PATENT DOCUMENTS

| 4,831,382 A * | 5/1989 | Debus, Jr. | ............. H03M 1/182 341/118 |
| 5,001,726 A * | 3/1991 | Kawai | ................ G01R 19/1658 327/72 |

(Continued)

OTHER PUBLICATIONS

Uematsu et al. "A Method for Measuring Vref Noise Tolerance of DDR2-SDRAM on Test Board Simulating Actual Memory Module." Electrical Performance of Electronic Packaging, 2007 IEEE. IEEE, 2007.

(Continued)

*Primary Examiner* — Joseph D Torres
(74) *Attorney, Agent, or Firm* — Patterson + Sheridan, LLP

(57) ABSTRACT

Embodiments herein describe a memory system that includes a DRAM module with a plurality of individual DRAM chips. In one embodiment, the DRAM chips are per DRAM addressable (PDA) so that each DRAM chip can use a respective reference voltage (VREF) value to decode received data signals (e.g., DQ or CA signals). During runtime, the VREF value can drift away from its optimal value set when the memory system is initialized. To address possible drift in VREF value, the present embodiments perform VREF calibration dynamically. To do so, the memory system monitors a predefined criteria to determine when to perform VREF calibration. To calibrate VREF value, the memory system may write transmit data and then read out the test data to determine the width of a signal eye using different VREF values. The memory system selects the VREF value that results in the widest signal eye.

13 Claims, 6 Drawing Sheets

(51) Int. Cl.
*G11C 29/04* (2006.01)
*G11C 5/14* (2006.01)
*G11C 11/16* (2006.01)
*G11C 16/34* (2006.01)
*G11C 11/4099* (2006.01)
*G06F 11/10* (2006.01)
*G11C 7/10* (2006.01)
*G11C 29/52* (2006.01)
*G11C 29/44* (2006.01)

(52) U.S. Cl.
CPC .......... *G11C 7/1066* (2013.01); *G11C 7/1093* (2013.01); *G11C 11/1673* (2013.01); *G11C 11/4099* (2013.01); *G11C 16/3431* (2013.01); *G11C 29/021* (2013.01); *G11C 29/028* (2013.01); *G11C 29/52* (2013.01); *G11C 2029/0409* (2013.01); *G11C 2029/0411* (2013.01); *G11C 2029/4402* (2013.01); *G11C 2029/5004* (2013.01); *G11C 2207/2254* (2013.01)

(58) Field of Classification Search
CPC .......... G11C 11/4099; G11C 29/50004; G11C 29/021; G11C 2029/0409
See application file for complete search history.

(56) References Cited

U.S. PATENT DOCUMENTS

| | | | |
|---|---|---|---|
| 5,736,875 A * | 4/1998 | Sakamoto | H03K 5/086 327/514 |
| 7,000,128 B1 * | 2/2006 | Broach | H03K 17/687 323/271 |
| 7,495,479 B1 * | 2/2009 | Hsu | G11C 27/024 327/94 |
| 7,647,467 B1 | 1/2010 | Hutsell et al. | |
| 8,553,469 B2 * | 10/2013 | Berke | G06F 13/1673 365/189.02 |
| 8,850,155 B2 | 9/2014 | Brandl et al. | |
| 9,620,184 B1 * | 4/2017 | Bialas, Jr. | G11C 29/021 |
| 9,691,453 B1 * | 6/2017 | Bialas, Jr. | G11C 29/021 |
| 9,711,189 B1 * | 7/2017 | Wang | G11C 11/4074 |
| 2002/0147949 A1 * | 10/2002 | Lamb | G11C 5/147 714/718 |
| 2003/0101015 A1 * | 5/2003 | Douskey | G01R 31/31813 702/120 |
| 2004/0183559 A1 * | 9/2004 | Ware | G01R 31/31707 324/750.3 |
| 2004/0264615 A1 * | 12/2004 | Ho | H04L 25/03006 375/355 |
| 2006/0092715 A1 * | 5/2006 | Braun | G11C 7/1078 365/189.05 |
| 2006/0190642 A1 * | 8/2006 | Aldereguia | G06F 11/24 710/60 |
| 2006/0227912 A1 * | 10/2006 | Leibowitz | G01R 31/31709 375/350 |
| 2007/0143644 A1 * | 6/2007 | Aldereguia | G11B 20/10009 714/700 |
| 2008/0005629 A1 * | 1/2008 | Windler | G01R 31/3171 714/712 |
| 2009/0046813 A1 * | 2/2009 | Hovis | G11C 7/1042 375/317 |
| 2010/0013454 A1 * | 1/2010 | Dreps | G11C 5/04 323/364 |
| 2010/0162037 A1 | 6/2010 | Maule et al. | |
| 2011/0074462 A1 * | 3/2011 | Chung | H03K 19/0005 326/30 |
| 2011/0075496 A1 * | 3/2011 | Mueller | G06F 13/1694 365/193 |
| 2011/0141827 A1 * | 6/2011 | Mozak | G11C 5/147 365/189.09 |
| 2013/0339821 A1 * | 12/2013 | Cordero | G06F 11/1666 714/773 |
| 2014/0086291 A1 * | 3/2014 | Asmanis | H04L 25/061 375/224 |
| 2014/0253208 A1 * | 9/2014 | Ruberg | H04L 25/028 327/331 |
| 2015/0309726 A1 * | 10/2015 | McCall | G11C 5/147 710/5 |
| 2016/0035411 A1 * | 2/2016 | Yu | G11C 11/4091 365/189.07 |
| 2016/0196857 A1 * | 7/2016 | Lee | G11C 5/02 365/189.02 |
| 2016/0292094 A1 * | 10/2016 | Jeter | G06F 13/1668 |

OTHER PUBLICATIONS

Micheletti, "Tuning DDR4 for Power and Performance." Teledyne LeCroy. (2013).

Trung, "DDR4 Designing for Power and Performance", Proceedings 2013, track2, MemCon 2013.

Sethuraman et al. "Vref optimization in DDR4 RDIMMs for improved timing margins." Electrical Design of Advanced Packaging & Systems Symposium (EDAPS), 2014 IEEE. IEEE, 2014.

Niu et al., "Ultrascale DDR4 De-emphasis and CTLE Feature Optimization with Statistical Engine for BER Specification" DesignCon 2015.

* cited by examiner

REFERENCE VOLTAGE CALIBRATION IN MEMORY DURING RUNTIME

BACKGROUND

The present invention relates to computer memory, and more specifically, to calibrating a reference voltage during runtime of the memory.

The introduction of double data rate fourth generation (DDR4) introduced Per DRAM Addressability (PDA) so that different dynamic random-access memory (DRAM) chips in the same DRAM module can have different parameters. That is, each chip in a group of DRAM chips (e.g., a rank) can have different parameters. Typically, PDA is used during the initial program load (IPL) when a DRAM module is booted—i.e., powered on. During IPL, the memory system can configure the parameters for each DRAM chip of the DRAM module. To do so, the DRAM module is placed in a PDA mode and the unique DRAM locations (e.g., registers) that define the parameters of each DRAM chip are programmed by using posted mode register set (MRS) commands, address inputs, and DQ data signals. Once programmed, the PDA mode is deactivated. The parameters are not typically adjusted after IPL is complete.

SUMMARY

According to one embodiment described herein, a memory system includes a plurality of DRAM chips where each DRAM chip is configured to use a reference voltage (VREF) to decode data signals. The memory system includes logic configured to monitor a predefined criteria during runtime of the memory system, the predefined criteria indicating when VREF calibration should be performed. The memory system a VREF calibration module configured to, in response to satisfying the predefined criteria during runtime, sweep a VREF value for at least one of the plurality of DRAM chips through a plurality of VREF values while transmitting test data to the at least one DRAM chip, determine respective widths of signals eyes corresponding to the plurality of VREF values, and select an updated VREF value for the at least one DRAM chip based on the respective widths of the signal eyes.

Another embodiment described herein includes a memory system. The memory system includes a DDR4 DRAM chip configured to use a reference voltage to decode data signals and logic configured to monitor a predefined criteria during runtime of the memory system, the predefined criteria indicating when VREF calibration should be performed. The memory system includes a VREF calibration module configured to, in response to satisfying the predefined criteria during runtime, sweep a VREF value for the DRAM chip through a plurality of VREF values while transmitting test data to the DRAM chip, determine respective widths of signals eyes corresponding to the plurality of VREF values, and select an updated VREF value for the DRAM chip based on the respective widths of the signal eyes.

Another embodiment described herein includes a method that includes monitoring a predefined criteria during runtime of a memory system, the predefined criteria indicating when VREF calibration should be performed, and where the memory system comprises a plurality of DRAM chips where each DRAM chip is configured to use a reference voltage to receive data signals. The method includes, in response to satisfying the predefined criteria during runtime of the memory system, sweeping a VREF value for at least one of the plurality of DRAM chips through a plurality of VREF values while transmitting test data to the at least one DRAM chip, determining respective widths of signals eyes corresponding to the plurality of VREF values, and selecting an updated VREF value for the at least one DRAM chip based on the respective widths of the signal eyes.

DETAILED DESCRIPTION

Figure 1:
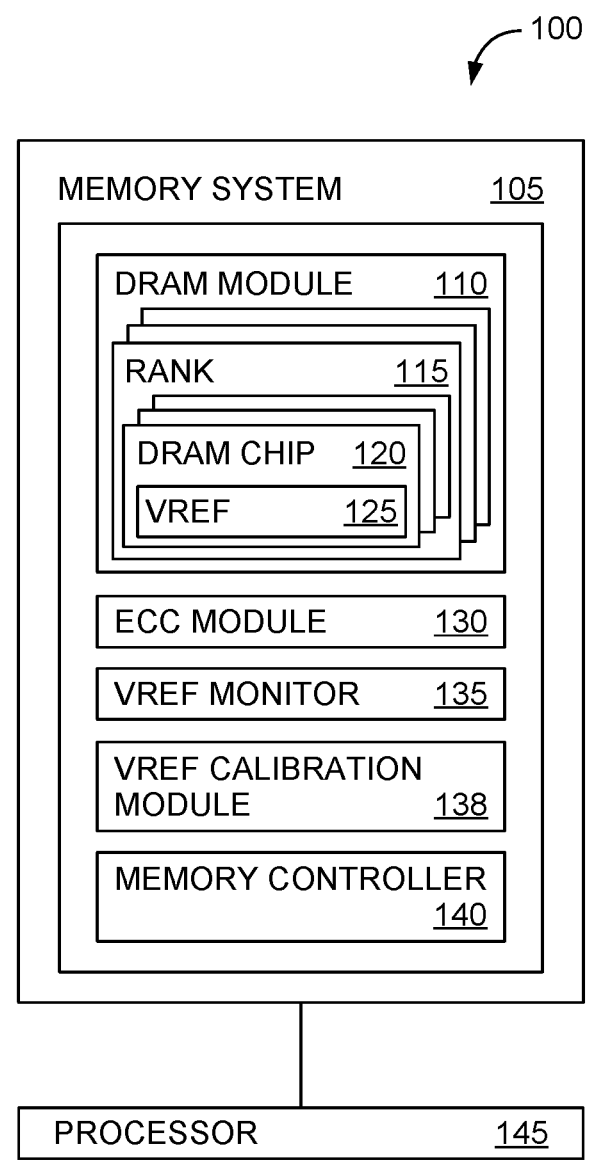
FIG. 1 is a block diagram of a memory system with a dynamic reference voltage, according to one embodiment described herein.

Embodiments herein describe a memory system that includes a DRAM module with a plurality of individual DRAM chips. In one embodiment, the DRAM chips are per DRAM addressable (PDA) so that individual parameters of the chips can be different. For example, each DRAM chip may use one or more respective reference voltage (VREF) values for signals (e.g., VREFDQ, VREFCA, etc., which may be referred to as a "VREF signals") to decode received signals (e.g., data (DQ) or command/address (CA) signals). Changing the VREF value alters the vertical alignment of a signal eye (e.g., a DQ signal eye or CA signal eye) which changes the width of the eye. In one embodiment, VREF calibration is performed during the IPL when the DRAM module is in the PDA mode. During VREF calibration, the VREF value can be iteratively varied to identify the VREF value that results in the greatest signal eye width. For example, the signal eye width can be identified for each value of VREF, and the value of VREF corresponding to the signal eye with the greatest signal eye width can then be identified among the signal eye widths. VREF calibration during IPL can take several seconds to perform for a rank of DRAM chips.

After IPL, the VREF value for a DRAM chip may drift. That is, during runtime, when the DRAM module performs reads and writes for a computing system, the VREF value can drift (e.g., shift up or down) away from its optimal value. For example, the VREF signal may be derived from a VDD power supply voltage outputted by a voltage regulator module (VRM). However, the VRM may permit the VREF value to drift, which can negatively impact the signal eye. In another example, electrical noise from the environment can cause the VREF value to drift away from its optimal value. To address possible drift in the VREF value, the present embodiments perform VREF calibration dynamically,—i.e., during runtime. It should be noted that though VREF calibration is described herein with respect to DRAM and with reference to DDR4, the same principles may be applied to other suitable types of memory and standards.

In one embodiment, the memory system (e.g., of a computing system) monitors one or more predefined criteria to determine when to perform VREF calibration. For example, the memory system may monitor the number of correctable errors (e.g., single bit per word errors) detected in a DRAM chip, compare the current VREF value to one or more threshold voltages, and/or use a predefined time period to determine when to trigger VREF calibration. The memory system can perform VREF calibration on one DRAM chip or on multiple chips to adjust their respective VREF values. To calibrate the VREF signal, the memory system may write to, and then read from the DRAM chip, test data to determine the width of the signal eye using different VREF values (e.g., among a set of predetermined VREF values, within a range of VREF values, etc.). The memory system then selects the VREF value that results in the widest signal eye.

FIG. 1 is a block diagram of a computing system 100 with a dynamic VREF value 125 (e.g., as configured in a register), according to one embodiment described herein. The computing system 100 includes a memory system 105 and a processor 145. During runtime, the processor 145 transmits read requests to the memory system 105 to retrieve data stored in the memory system 105 and transmits write requests to the memory system 105 to store data in the memory system 105. Although FIG. 1 illustrates a single processor 145, the processor 145 can represent any number of processors that include any number of processing cores.

The memory system 105 includes a DRAM module 110, an error correction code (ECC) module 130, a VREF monitor 135, a VREF calibration module 138, and a memory controller 140. The DRAM module 110 may include a substrate (e.g., a printed circuit board) that supports multiple DRAM chips 120 organized into one or more ranks 115. In one embodiment, each rank 115 may define a row of DRAM chips 120 arranged on a common substrate. The DRAM chips 120 are individual integrated circuits that include storage elements (e.g., DRAM cells) for storing data. Each read and write request from the processor 145 includes an address (or addresses) that corresponds to a particular memory location in a particular DRAM chip 120. Once the correct DRAM chip 120 is identified, in the case of write request, storage elements in the identified chip 120 are updated to store the received data (e.g., included in the write request). In the case of a read request, storage elements in the identified chip 120 are read out to provide the requested data to the processor 145.

Each DRAM chip 120 generates a VREF value 125 that is used to decode received data (DQ) signals (and/or similarly another VREF signals to generate a VREF value, which is used to decode received CA signals). Though the following embodiment is described with respect to DQ signals, the same principles can also be applied to other appropriate signals, such as, CA signals. In one embodiment, VREF value 125 is used as a threshold value which is compared to a DQ signal to differentiate between logical ones and zeros in the DQ signal. As recited above, the VREF value 125 may be set during IPL when the DRAM module 110 is booted or powered on. However, the VREF value 125 may drift as a result of fluctuations in the power supply or electrical noise. These variations in the VREF value 125, however, alter the width of the DQ signal eye. When the width of the eye shrinks, the likelihood of reading incorrect data on the data bus lines may increase. As such, the embodiments herein describe various techniques for dynamically adjusting the value of the VREF signal during runtime by performing VREF calibration.

In one embodiment, the memory system 105 uses the VREF calibration module 138 to perform VREF calibration (e.g., during runtime). The VREF calibration module 138 can be either hardware or firmware in the memory system 105. In one embodiment, the VREF calibration module 138 includes respective logic within each of the DRAM chips 120. Alternatively, the VREF calibration module 138 may be logic disposed in the memory controller 140. Further, the calibration module 138 may be disposed on a separate integrated circuit in the memory system 105. As described in more detail below, the memory system 105 monitors one or more predefined criteria to determine when to perform VREF calibration during runtime. Once the criteria is satisfied, the VREF calibration module 138 performs VREF calibration on at least one of the DRAM chips 120 to identify an optimized VREF value 125.

In one embodiment, the VREF calibration module 138 uses data gathered by the ECC module 130 to determine when to perform VREF calibration. Although the ECC module 130 is illustrated as a separate component, in one embodiment a respective ECC module 130 may be located in each of the DRAM chips 120, or the ECC module 130 may be integrated into the memory controller 140. Regardless of its location, the ECC module 130 monitors the number of correctable errors (e.g., single bit per word errors) detected in the DRAM chips 120. For example, electrical or magnetic interference inside a computer system (e.g., alpha particles or background radiation from neutrons or cosmic rays) can cause a single bit in DRAM to spontaneously flip to the opposite state. In one embodiment, the ECC module 130 determines the number of correctable errors detected in each of the chips 120, and if the errors for one of the chips 120 exceeds a threshold, the VREF calibration module 138 performs VREF calibration for that chip 120. In another example, the ECC module 130 may determine an error rate for each of the chips 120 and trigger VREF calibration if the rate for anyone of the chips 120 exceeds a threshold.

In one embodiment, the VREF calibration module 138 uses data gathered by the VREF monitor 135 to trigger VREF calibration. The VREF monitor 135 (which may be integrated into each DRAM chip 120) compares the current VREF value 125 to one or more predefined thresholds to determine if the VREF value 125 has drifted away from its optimal value. In one embodiment, the VREF monitor 135 compares the current VREF value a high voltage threshold and a low voltage threshold. If the VREF value for anyone of the chips 120 crosses either of these thresholds, the VREF calibration module 138 performs VREF calibration for that chip 120.

In one embodiment, the VREF calibration module 138 uses the memory controller 140 to determine when to perform VREF calibration during runtime. For example, the memory controller 140 may determine how much time has elapsed since VREF 125 for each of the DRAM chips 120 has been calibrated. If the elapsed time exceeds a threshold, the memory controller 140 may trigger VREF calibration.

Although one DRAM module 110 is shown, the memory system 105 may include any number of modules 110 with any number of DRAM chips 120. Further, the DRAM chips 120 may be compatible with DDR4 which supports a PDA mode so that the VREF value 125 for each of the DRAM chips 120 can be set to different values. However, even though PDA permits the memory system 105 to change a particular VREF value 125, in other embodiments, VREF calibration can be performed on multiple chips 120 (e.g., a rank 115 or a sub-portion of the chips 120 in the rank 115) simultaneously such that the same VREF value 125 may be assigned to multiple chips 120.

Figure 2:
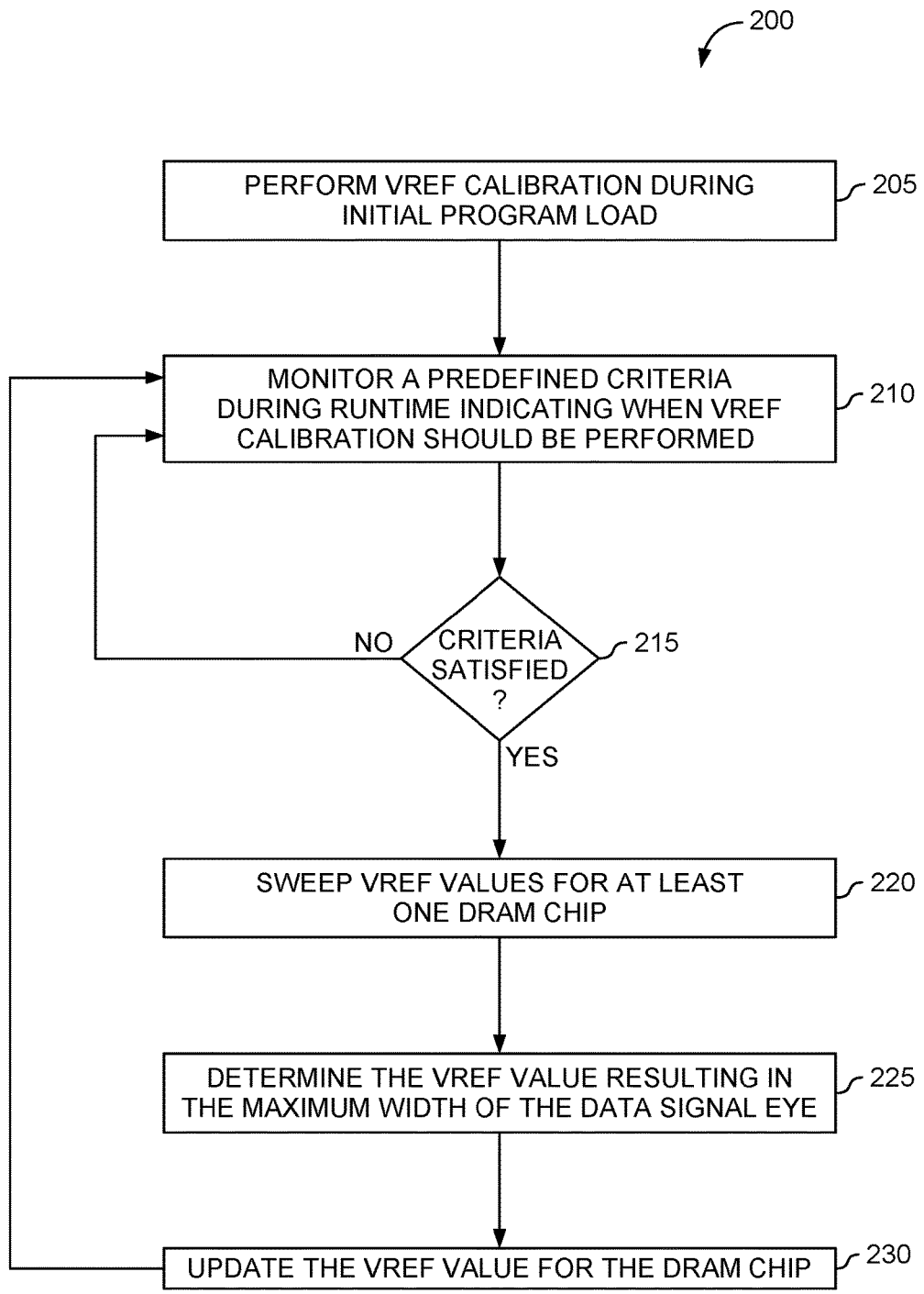
FIG. 2 is a flow chart for adjusting a reference voltage for a DRAM chip during runtime, according to one embodiment described herein.

FIG. 2 is a flow chart of a method 200 for adjusting the VREF value for a DRAM chip during runtime, according to one embodiment described herein. At block 205, the memory system performs VREF calibration during IPL to set an optimized value for VREF for each of the DRAM chips in the DRAM module. In one embodiment, once in the PDA mode, the memory controller locks the data bus to the DRAM chip being calibrated and transmits data to, and receives data from, the selected DRAM chip to determine the width of the DQ eye for various VREF values. In one embodiment, for each value of VREF, the memory controller writes and then reads the same test data from a DRAM chip. The memory controller measures a width of the DQ eye corresponding to each of the VREF values. After iterating through the VREF values, the memory controller selects the VREF value that results in the widest DQ eye. This VREF value is then used by the DRAM chip during runtime to decode DQ signals. The memory controller can repeat this process for each of the DRAM chips in the DRAM module to identify an optimized VREF value. Performing VREF calibration during IPL can take several seconds for each rank in the DRAM module.

At block 210, the memory system monitors one or more predefined criteria during runtime indicating when VREF calibration should be performed. In one embodiment, the predefined criteria is the number of correctable errors (CE) or soft errors detected in a DRAM chip. These errors may occur because of noise or interference which prevents the DRAM chip from reading or writing the correct data and/or corrupts the data in the DRAM chip. Alternatively or additionally, the predefined criteria is a voltage threshold which is compared to the current VREF value for a DRAM chip. In one example, the memory system may ensure the VREF value is between a low threshold and a high threshold—i.e., a voltage range. Alternatively or additionally, the predefined criteria is a time period that is reset each time a VREF calibration is performed. The memory system monitors the time periods for the DRAM chips to determine when they reach a threshold value which indicates VREF calibration should be performed again.

At block 215, the memory system determines if the one or more criteria are satisfied. For example, an ECC module in the DRAM chip may maintain a count of the CEs which is compared to a threshold value, or a VREF voltage monitor may, at intervals, compare the current value of VREF to high and low voltage thresholds. In this manner, the memory system monitors the current state of the memory system during runtime to determine if VREF calibration should be performed.

In one embodiment, the memory system may use a combination of the predefined criteria described above to determine when to trigger VREF calibration. For example, the memory system may monitor the number of CEs generated by the DRAM chips as well as the elapsed time since the VREF calibration was last performed on the chips. If the number of CEs exceeds a threshold, the memory system may trigger VREF calibration, otherwise, the system may wait until the elapsed time has reached a threshold before performing VREF calibration.

If the one or more criteria are not satisfied, method 200 returns to block 210. However, if the one or more criteria are satisfied, method 200 proceeds to block 220 where the VREF calibration module performs VREF calibration for one or more of the DRAM chips. To do so, the VREF calibration module sweeps through VREF values for at least one DRAM chip. Before doing so, in one embodiment, the calibration module may switch the selected DRAM chip into a PDA mode so that the chip is individually addressable. However, in some embodiments, the data bus for the DRAM chips do not need to be locked. Moreover, instead of using predefined test data to perform VREF calibration, the VREF calibration module may use functional data that was received from the processor to perform VREF calibration. That is, rather than using predefined test data to perform VREF calibration during IPL, when performing VREF calibration during runtime, the VREF calibration module may use functional data found in write requests received by the processor. Doing so may mitigate any negative impact performing VREF calibration during runtime has on memory performance.

For each VREF value, the calibration module determines the width of the corresponding DQ eye. Generally, changing VREF changes the height of the eye which has a corresponding effect on the slope and width of the eye. At block 225, the calibration module determines the VREF value resulting in the maximum width of the data signal eye—e.g., the DQ signal eye.

In addition or alternative to determining the optimized VREF value for receiving DQ signals, the calibration module may use method 200 to trigger VREF calibration for a reference voltage used when receiving command and address (CA) data on a CA bus. For example, the DRAM chips may also use a VREF value for a VREF signal to decode received CA data, which may have a different value than the VREF signal used to decode received DQ data. By sweeping the values of VREF used to receive data on the CA bus, the calibration module can identify the VREF value that provides the widest CA data eye. In this manner, the memory system can also perform VREF calibration for CA signals during runtime.

At block 230, the VREF calibration module updates the VREF value for the DRAM chip. For example, the value may be used to compensate for drift that may occur or from interference from a source either internal or external to the memory system. The DRAM chip uses the new VREF value to decode the DQ (or CA) signals.

Although the memory system can perform VREF calibration on a per chip basis, the memory system may also perform VREF calibration during runtime on a plurality of DRAM chips—e.g., a rank of DRAM chips. For example, if the requisite time has elapsed since VREF calibration was last performed on a rank, the memory system may perform VREF calibration on all the chips in the rank. However, if the number of CEs generated by a particular DRAM chip in the rank exceeds a threshold (before the requisite time has elapsed), the calibration module may perform VREF calibration for only that chip.

In one embodiment, as will be discussed in greater detail below, the memory system can also adjust gate settings which change the time delay for the read and write signals provided to the DRAM chip. Varying these settings also changes the width of the DQ eye. Put differently, the memory system can adjust the VREF value as described above which changes the height of the DQ eye while simultaneously (or separately) changing the gate settings to identify values that result in a DQ eye with the widest width.

Figure 3:
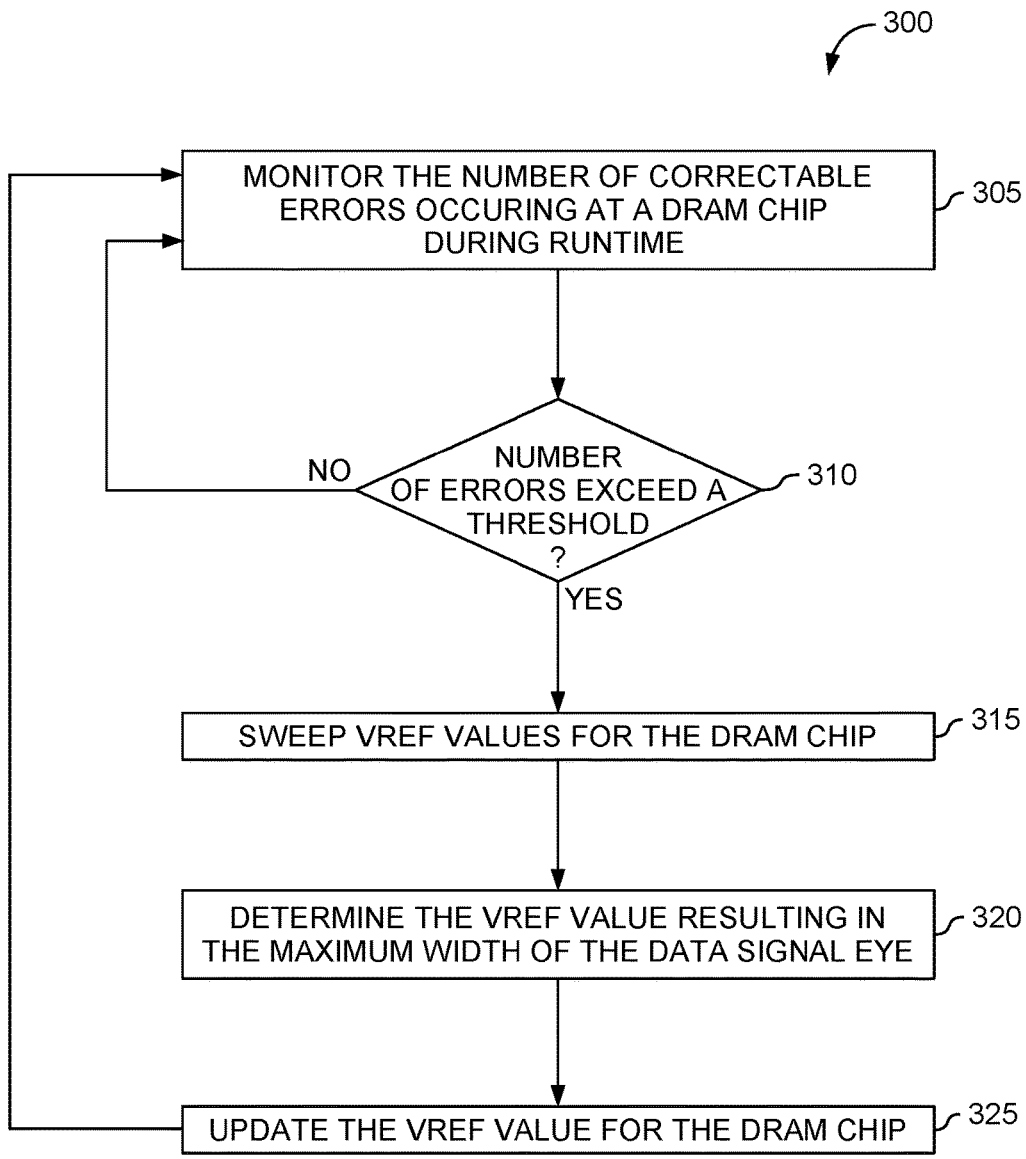
FIG. 3 is a flow chart for adjusting a reference voltage for a DRAM chip in response to correctable errors, according to one embodiment described herein.

FIG. 3 is a flow chart of a method 300 for adjusting a reference voltage for a DRAM chip in response to correctable errors, according to one embodiment described herein. Method 300 assumes that the memory system is already executing—i.e., IPL has been performed—and is responding to read and write requests transmitted by a processor. As illustrated in FIG. 2, as part of the IPL, the memory system may have already identified an optimized VREF value for decoding data signals.

At block 305, the memory system monitors the number of CEs occurring at a DRAM chip during runtime. In one embodiment, each DRAM chip may include an ECC module (e.g., hardware or firmware logic) which identifies CEs as they occur on a chip. Alternatively, the memory controller may include the ECC module which identifies correctable errors on all the DRAM chips in the memory system. In this embodiment, an ECC transparency mechanism is built into the memory system which permits the ECC module in the memory controller to count the number of CEs as part of a check performed by the memory controller (e.g., a row based or page based counter).

At block 310, the ECC module determines whether the number of CEs at each DRAM chip exceeds a threshold. If none of the CEs for each of the DRAM chips exceed the threshold, method 300 returns to block 305. However, if one or more of the CEs for the DRAM chips exceed the threshold, method 300 proceeds to block 315 where the memory system sweeps VREF values for the DRAM chip(s) that generated the CEs exceeding the threshold.

In one embodiment, VREF calibration is performed without locking the data bus. That is, unlike when performing VREF calibration during IPL, VREF calibration can be performed, for example, during idle cycles. For instance, the memory controller can issue mode register set (MRS) commands only for the DRAM chip (or chips) that generated CEs above the threshold. The VREF training in the PDA mode can occur during idle cycles or can be performed when performing the write requests received from the processor. Stated differently, VREF calibration can be performed using the functional data received from the processor rather than predefined test data. In this manner, any negative effects from performing VREF calibration during runtime can be mitigated. Furthermore, in one embodiment, the memory controller can set the DRAM chip being calibrated as a spare DRAM.

At block 320, the memory system determines the VREF value resulting in the maximum width of the data signal eye—e.g., DQ data or CA data. As described above, for each of the VREF values swept during block 315, the memory system measures a corresponding width of the signal eye and then selects the VREF value that results in the eye with the greatest width.

At block 325, the memory system updates the VREF value for the DRAM chip. In one embodiment, the memory system resets the CE count for the DRAM chip after VREF calibration is performed and method 300 returns to block 305.

Figure 4:
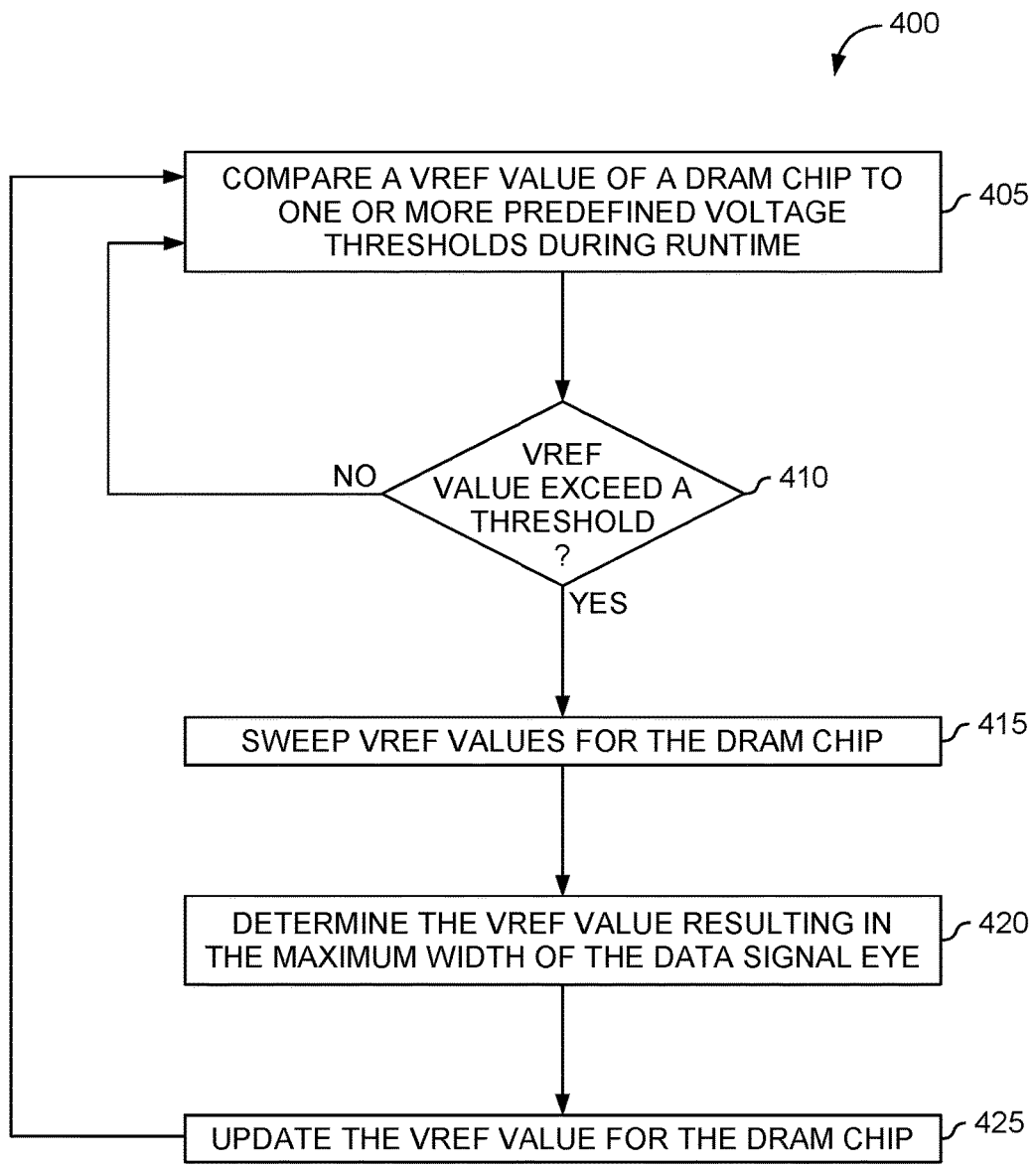
FIG. 4 is a flow chart for adjusting a reference voltage for a DRAM chip in response to voltage drift, according to one embodiment described herein.

FIG. 4 is a flow chart of a method 400 for adjusting a VREF value for a DRAM chip in response to a voltage drift, according to one embodiment described herein. Like method 300, method 400 assumes that the memory system is already executing—i.e., IPL has been performed—and is responding to read and write requests transmitted by a processor.

At block 405, the memory system compares a VREF value of a DRAM chip to one or more predefined voltage thresholds during runtime. In one embodiment, the memory system includes the VREF monitor that compares the VREF value of the DRAM chip to the predefined voltage thresholds. The VREF monitor may be hardware or firmware logic in each of the DRAM chips. In this example, each DRAM chip has an individual VREF monitor for monitoring VREF value. Alternatively, the VREF monitor may be circuitry external to the DRAM chips (e.g., an op amp) which receives the VREF values from the DRAM chips for testing. In one embodiment, a centralized VREF monitor can be used to monitor VREF values for multiple DRAM chips.

At block 410, the VREF monitor determines if the VREF value exceeds one of the thresholds. For example, the VREF monitor may compare the VREF value to a low voltage threshold and a high voltage threshold. If the VREF value is between the low and high voltage values—e.g., within a predefined range—the memory system does not perform VREF calibration and method 400 returns to block 405. However, if the VREF value is not within the range, method 400 proceeds to block 415 where the memory system performs VREF calibration.

Like above, VREF calibration can be performed without locking the bus to the DRAM chip. For instance, the memory controller can issue MRS commands only for the DRAM chip (or chips) whose VREF value exceeds the high or low voltage thresholds. The DRAM chip can be switched to the PDA mode and the VREF calibration can occur during idle cycles or can be performed when performing the write requests received from the processor, which mitigates the effect of performing VREF calibration during runtime on the performance of the memory system.

At block 420, the memory system determines the VREF value resulting in the maximum width of the signal eye—e.g., DQ data or CA data. As described above, for each of the VREF values swept during block 415, the memory system measures a corresponding width of the signal eye and then selects the VREF value that results in the eye with the greatest width. At block 425, the memory system updates the VREF value of the DRAM chip and method 400 returns to block 405.

Figure 5:
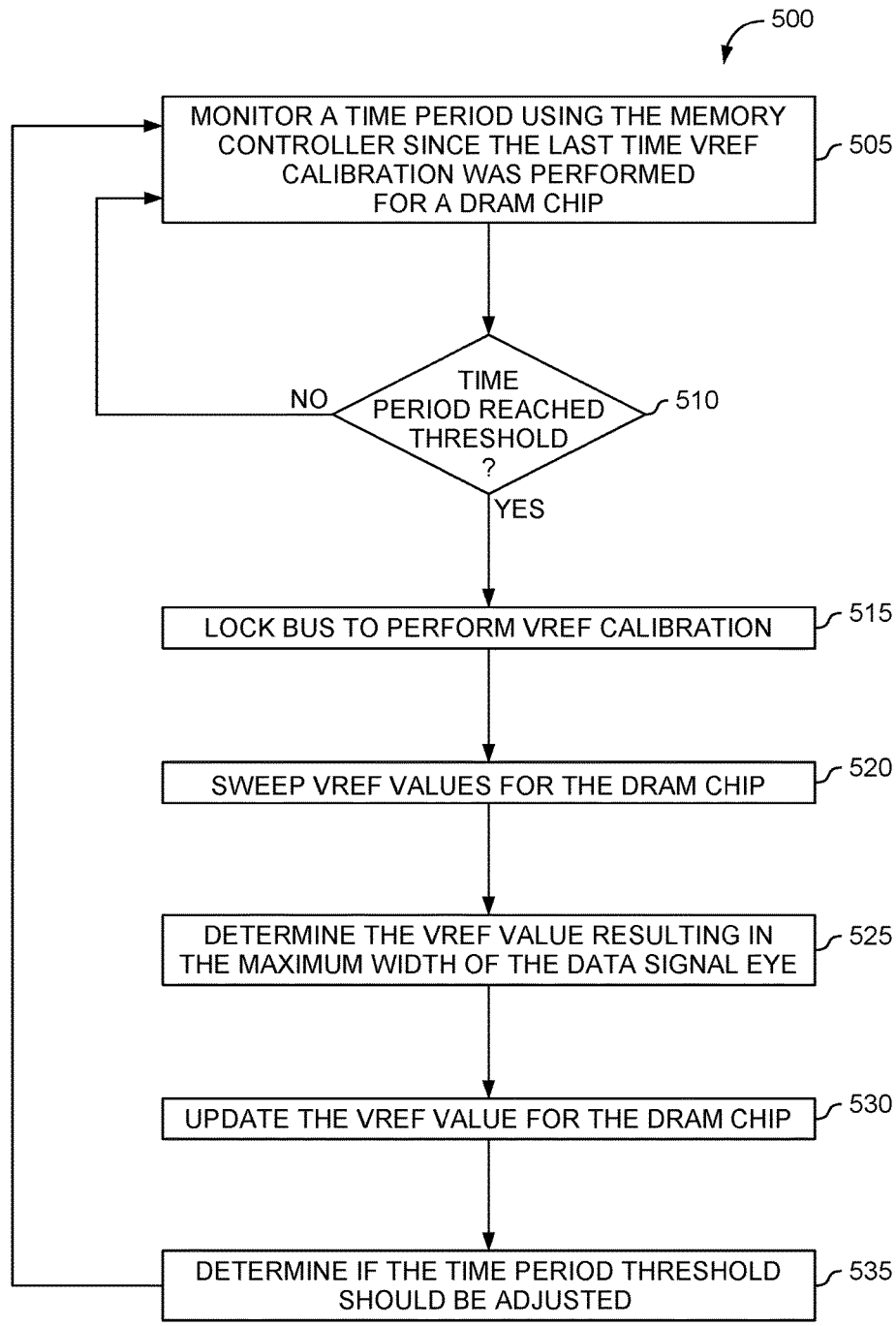
FIG. 5 is a flow chart for periodically adjusting a reference voltage for a DRAM chip, according to one embodiment described herein.

FIG. 5 is a flow chart of a method 500 for adjusting a VREF value for a DRAM chip periodically, according to one embodiment described herein. Like methods 300 and 400, method 500 assumes that the memory system is already executing—i.e., IPL has been performed—and is responding to read and write requests transmitted by a processor.

At block 505, the memory controller monitors a time period since the last time VREF calibration was performed for DRAM chip. In one embodiment, the memory controller maintains a count or timer for each DRAM chip or for a group of chips (e.g., a rank or half of a rank). For example, the memory controller may have a different count or timer for each rank of DRAM chips.

At block 510, the memory controller determines if the time period or count has reached a predefined value. Once the time period expires, the memory controller proceeds to block 515 to perform VREF calibration. In one embodiment, the memory controller may stagger the time periods so the VREF calibration is performed at different time for different chips. That way, the time periods for the DRAM chips do not expire at the same time. As such, VREF calibration can be spread out rather than trying to perform VREF calibration on all the DRAM chips at the same time.

Moreover, using a predefined time period to trigger VREF calibration assumes that after a certain period of time, interference or variation in the power supply causes VREF to drift from its optimal value. This predefined time period may be found via experimentation or may be found based on historical use of the memory system. Moreover, as discussed in more detail below, the predefined time period may change in response to other metrics measured by the memory system.

If the requisite time period has elapsed, method 500 proceeds to block 515 where VREF calibration is performed. In this embodiment, because periodic VREF calibration is initiated by the memory controller, the memory controller locks the bus and grants exclusive access to the bus for performing VREF calibration. Locking the bus is beneficial in cloud environments where a hypervisor and/or firmware can ensure the DRAM chips have the optimal VREF values before allocating or provisioning the memory system to virtual machines. However, locking the bus may have a negative impact on the performance of the memory system if received read or write requests are available on the queue but cannot be sent to the DRAM chips because the data bus is locked for VREF calibration. Thus, in other embodiments, it may be preferred to perform VREF calibration using, e.g., idle cycles of the data received from the processor where the data bus is not locked.

At block 515, the memory system sweeps VREF values for the DRAM chip identified at block 510. At block 520, the memory system determines the VREF value resulting in the maximum width of the data signal eye. At block 525, the memory system updates the VREF value for the DRAM chip 530. Once VREF calibration is complete, if the bus is locked, the memory system unlocks the bus and switches the selected DRAM chip from the PDA mode.

At block 535, the memory system determines if the time period threshold should be adjusted. As mentioned above, the predefined time period may change in response to other metrics measured by the memory system. For example, the memory system may decrease the time period required between performing VREF calibration for a DRAM chip if the rate of CEs generated by the DRAM chip increases. That is, the increase in CEs may be a result of the VREF value drifting, which shrinks the signal eye and increases the risk of errors. In response, the memory system may perform VREF calibration more frequently for this DRAM chip than others.

In another example, the memory system may use environmental sensors in the DRAM module to change the time period. For example, the memory system may include a temperature sensor which provides a temperature measurement of the DRAM chips. Because the temperature of the DRAM chips can affect the VREF value, the memory system may reduce the time period threshold for periodically training VREF as the temperature of the chips becomes more extreme.

In another example, the memory system may vary the time period threshold according to the number of times the value of the VREF signal crosses the low and high voltages discussed in method 400. If the VREF value crosses the low and high voltages more frequently (which may trigger VREF calibration as discussed in method 400), the memory system may reduce the time period so that VREF calibration is performed before the VREF value crosses the low/high voltages, which may reduce errors. Conversely, if VREF rarely cross the voltage thresholds, the memory system may increase the time period used for triggering periodic VREF calibration.

Figure 6:
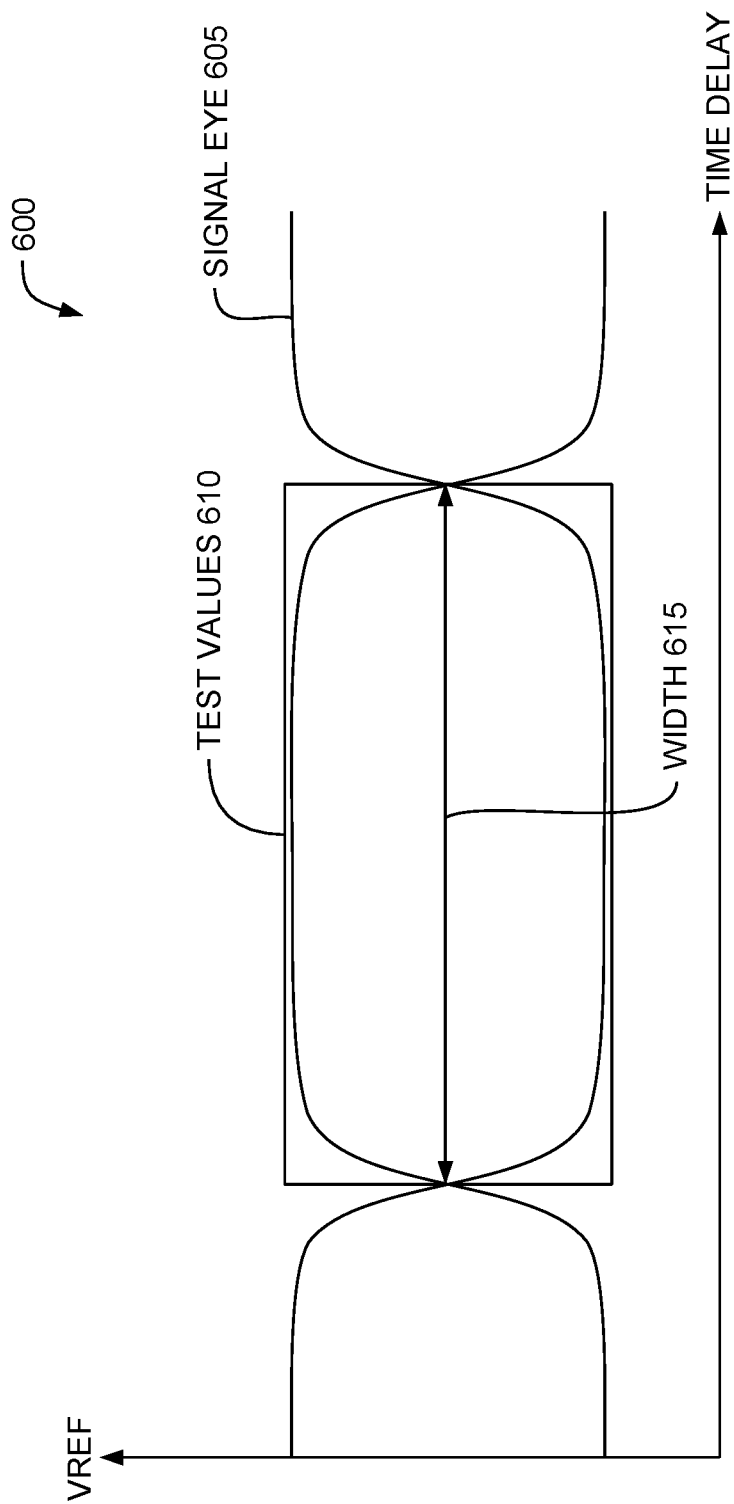
FIG. 6 is a chart that illustrates the effect of a reference voltage on the width of a signal eye, according to one embodiment described herein.

FIG. 6 is a chart 600 that illustrates the effect of the VREF value on the width of a signal eye 605, according to one embodiment described herein. Chart 600 illustrates a signal eye 605 for a particular VREF value (along the y axis) and time delay (along the x axis). The memory system can measure a width 615 of the signal eye 605. As mentioned above, the width can change as the value of VREF and the time delay various. That is, altering these values can widen or shrink the width 615.

The embodiments described above provide different techniques for identifying the VREF value (or the height of the eye 605) that provides the widest opening for the eye 605. In addition to adjusting the VREF value during runtime, the memory system may also adjust the time delay (e.g., change the stress and hold times) for the data signals. In one embodiment, the memory system may sweep the VREF values and time delay values through different combinations of these values contained within the test values 610. Stated differently, the memory system may use different combinations of the VREF values and time delay values within test values 610 and identify the combination that results in the signal eye 605 with the widest width 615. In one embodiment, the memory system may sweep through both VREF values and time delay values in response to any of the predefined criteria discussed above being satisfied—e.g., number of CEs, time period thresholds, or VREF voltage thresholds. Moreover, the VREF values and time delay values may be swept to find optimized values for DQ signals as well as CA signals.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

In the preceding, reference is made to embodiments presented in this disclosure. However, the scope of the present disclosure is not limited to specific described embodiments. Instead, any combination of the features and elements described herein, whether related to different embodiments or not, is contemplated to implement and practice contemplated embodiments. Furthermore, although embodiments disclosed herein may achieve advantages over other possible solutions or over the prior art, whether or not a particular advantage is achieved by a given embodiment is not limiting of the scope of the present disclosure. Thus, the aspects, features, embodiments and advantages described herein are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

Aspects of the present invention may take the form of an entirely hardware embodiment, an entirely software embodiment (including firmware, resident software, microcode, etc.) or an embodiment combining software and hardware aspects that may all generally be referred to herein as a "circuit," "module" or "system."

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the foregoing is directed to embodiments of the present invention, other and further embodiments of the invention may be devised without departing from the basic scope thereof, and the scope thereof is determined by the claims that follow.

What is claimed is:

1. A memory system, comprising:
 a printed circuit board (PCB);
 a plurality of dynamic random-access memory (DRAM) chips mounted on the PCB, wherein each DRAM chip is configured to use a reference voltage (VREF) to decode data signals;
 error-correcting code (ECC) logic comprising circuitry mounted on the PCB and in electrical communication with the plurality of DRAM chips, the ECC logic circuitry configured to individually monitor a predefined criteria associated with each of the plurality of DRAM chips during runtime of the memory system, the predefined criteria indicating when VREF calibration should be performed; and a VREF calibration module comprising at least one of firmware and hardware configured to, in response to satisfying the predefined criteria for at least one of the plurality of DRAM chips during runtime:
sweep a VREF value for the at least one DRAM chip through a plurality of VREF values while transmitting test data to the at least one DRAM chip,
determine respective widths of signals eyes corresponding to the plurality of VREF values, and
select an updated VREF value for the at least one DRAM chip based on the respective widths of the signal eyes, wherein the updated VREF value corresponds to one of the signal eyes with the greatest width, wherein the updated VREF value is used by the at least one DRAM chip to decode both data (DQ) signals and command/address (CA) signals.

2. The memory system of claim 1, wherein the error correction logic is configured to determine a number of correctable errors generated by the at least one DRAM chip, and wherein the predetermined criteria is satisfied when the number of correctable errors satisfies a threshold.

3. The memory system of claim 1, further comprising a VREF monitor configured to compare the VREF value to a low voltage threshold and a high voltage threshold, and wherein the predetermined criteria is satisfied when the VREF value is outside a voltage range established by the low and high voltage thresholds.

4. The memory system of claim 1, further comprising a memory controller configured to maintain at least one of a count and timer since the last time VREF calibration was performed on the at least one DRAM chip, wherein the VREF calibration module is configured to optimize VREF for the at least one DRAM chip when the timer exceeds a threshold even when the predetermined criteria is not satisfied.

5. The memory system of claim 1, wherein the plurality of DRAM chips are compatible with DDR4.

6. The memory system of claim 5, wherein the VREF calibration module is configured to switch the at least one DRAM chip to a Per DRAM Addressability (PDA) mode before sweeping the VREF value.

7. The memory system of claim 1, wherein before runtime, the VREF value is set to an optimized value during an initial program load (IPL).

8. The memory system of claim 7, wherein, when identifying the optimized value for the VREF value during IPL, the memory system transmits predefined data to the plurality of DRAM chips, and wherein, when sweeping the VREF value during runtime, the VREF calibration module transmits functional data received from an external processor as the test data to the at least one DRAM chip.

9. A method, comprising:
individually monitoring a predefined criteria associated with each of a plurality of dynamic random-access memory (DRAM) chips mounted on a printed circuit board (PCB) during runtime of a memory system, the predefined criteria indicating when VREF calibration should be performed, wherein each of the plurality of DRAM chips is configured to use a reference voltage (VREF) to receive data signals;
in response to satisfying the predefined criteria for at least one of the plurality of DRAM chips during runtime of the memory system:
sweeping a VREF value for the at least one DRAM chip through a plurality of VREF values while transmitting test data to the at least one DRAM chip, wherein the test data is received from an external processor in communication with the at least one DRAM chip via a bus coupling the processor to the PCB;
determining respective widths of signals eyes corresponding to the plurality of VREF values; and
selecting an updated VREF value for the at least one DRAM chip based on the respective widths of the signal eyes, wherein the updated VREF value corresponds to one of the signal eyes with the greatest width, wherein the updated VREF value is used by the at least one DRAM chip to decode both of data (DQ) signals and command/address (CA) signals.

10. The method of claim 9, wherein monitoring the predefined criteria during runtime of the memory system comprises:
determining a number of correctable errors generated by the at least one DRAM chip, and wherein the predetermined criteria is satisfied when the number of correctable errors satisfies a threshold.

11. The method of claim 9, wherein monitoring the predefined criteria during runtime of the memory system comprises:
comparing the VREF value to a low voltage threshold and a high voltage threshold, wherein the sweeping of the VREF value is triggered when the VREF value is outside a voltage range established by the low and high voltage thresholds, and wherein the predetermined criteria is satisfied when the VREF value is outside a voltage range established by the low and high voltage thresholds.

12. The method of claim 9, further comprising
maintaining at least one of a count and timer since the last time VREF calibration was performed on the at least one DRAM chip, wherein the sweeping of the VREF value is triggered when one of the count and timer exceeds the threshold and when the predetermined criteria is not satisfied.

13. The method of claim 9, wherein the plurality of DRAM chips are compatible with DDR4, the method further comprising:
switching the at least one DRAM chip to a Per DRAM Addressability (PDA) mode before sweeping the VREF value.

* * * * *